(12) United States Patent
Zide et al.

(10) Patent No.: US 9,136,456 B2
(45) Date of Patent: Sep. 15, 2015

(54) HIGH EFFICIENCY THERMOELECTRIC MATERIALS BASED ON METAL/SEMICONDUCTOR NANOCOMPOSITES

(75) Inventors: Joshua M. O. Zide, Goleta, CA (US); Arthur C. Gossard, Santa Barbara, CA (US); Ali Shakouri, Santa Cruz, CA (US); John E. Bowers, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 1403 days.

(21) Appl. No.: 11/763,326

(22) Filed: Jun. 14, 2007

(65) Prior Publication Data

US 2008/0001127 A1    Jan. 3, 2008

Related U.S. Application Data

(60) Provisional application No. 60/815,159, filed on Jun. 19, 2006.

(51) Int. Cl.
| | |
|---|---|
| *H01B 1/02* | (2006.01) |
| *C30B 25/02* | (2006.01) |
| *C30B 25/22* | (2006.01) |
| *C30B 29/40* | (2006.01) |
| *H01L 35/18* | (2006.01) |
| *H01L 35/26* | (2006.01) |
| *H01L 21/02* | (2006.01) |

(52) U.S. Cl.
CPC ............ *H01L 35/18* (2013.01); *H01L 35/26* (2013.01); *H01L 21/02392* (2013.01); *H01L 21/02463* (2013.01); *H01L 21/02502* (2013.01); *H01L 21/02546* (2013.01); *H01L 21/02601* (2013.01)

(58) Field of Classification Search
CPC .......... H01B 1/02; C30B 25/02; C30B 25/22; C30B 29/40
USPC ........................... 252/500–517, 518.1, 521.1; 257/52–200, E21.127
See application file for complete search history.

(56) References Cited

U.S. PATENT DOCUMENTS

2003/0015711 A1 *   1/2003   Talin et al. ...................... 257/76

OTHER PUBLICATIONS

Klenov et al. "Scanning transmission electron of ErAs nanoparticles embedded in epitaxial In0.53Ga0.47As layers." Applied Physics Letters, vol. 86, pp. 111912—published online Mar. 10, 2005.*

(Continued)

*Primary Examiner* — Tri V Nguyen
(74) *Attorney, Agent, or Firm* — Gates & Cooper LLP

(57) ABSTRACT

Composite epitaxial materials that comprise semimetallic ErAs nanoparticles or nanoislands epitaxially embedded in a semiconducting $In_{0.53}Ga_{0.47}As$ matrix both as superlattices and randomly distributed throughout the matrix are disclosed. The presence of these particles increases the free electron concentration in the material while providing scattering centers for phonons. Electron concentration, mobility, and Seebeck coefficient of these materials are discussed and their potential for use in thermoelectric power generators is postulated. These composite materials in accordance with the present invention have high electrical conductivity, low thermal conductivity, and a high Seebeck coefficient. The ErAs nanoislands provides additional scattering mechanism for the mid to long wavelength phonon—the combination reduces the thermal conductivity below the alloy limit.

14 Claims, 6 Drawing Sheets

(56) References Cited

OTHER PUBLICATIONS

Driscoll et al. "Growth and microstructure of semimetallic ErAs particles embedded in an In0.53Ga0.47As matrix." Journal of Crystal Growth. vol. 251, pp. 243-247, 2003.*

Stangl et al. ("Structural properties of self-organized semiconductor nanostructures") Rev. Mod Phys., vol. 76, pp. 725-783, Sep. 2004).*

Kadow et al. ("Growth-temperature dependence of the microstructure of ErAs islands in GaAs." J Vac Sci Technol B, 21(1), published Dec. 16, 2002).*

Kim et al. ("Thermal Conductivity Reduction and Thermoelectric Figure of Merit Increase by Embedding Nanoparticles in Crystalline Semiconductors." Phys Rev. Let., 96, p. 045901-1 to 4, published Feb. 2, 2006).*

Cahill, D.G., "Thermal conductivity measurement from 30 to 750 K: the 3ω method," Rev. Sci. Instrum., Feb. 1990, pp. 802-808, vol. 61, No. 2.

Cahill, D.G. et al., "Nanoscale thermal transport," J. Appl. Phys., Jan. 15, 2003, pp. 794-818, vol. 93, No. 2.

Dughaish, Z.H., "Lead telluride as a thermoelectric material for thermoelectric power generation," Physica B, 2002, pp. 205-223, vol. 322.

Harman, T.C. et al., "Quantum Dot Superlattice Thermoelectric Materials and Devices," Science, Sep. 27, 2002, pp. 2229-2232, vol. 297.

Hicks, L.D. et al., "Effect of quantum-well structures on the thermoelectric figure of merit," Physical Review B, May 15, 1993, pp. 12727-12731, vol. 47, No. 19.

Hicks, L.D. et al., "Thermoelectric figure of merit of a one-dimensional conductor," Physical Review B, Jun. 15, 1993, pp. 16631-16634, vol. 47, No. 24.

Humphrey, T.E. et al., "Reversible Thermoelectric Nanomaterials," Physical Review Letters, Mar. 11, 2005, pp. 096601-1-096601-4, vol. 94.

Huxtable, S.T. et al., "Thermal conductivity of Si/SiGe and SiGe/SiGe superlattices," Appl. Phys. Lett., Mar. 11, 2002, pp. 1737-1739, vol. 80, No. 10.

Kim, I-H., "(Bi,Sb)2(Te,Se)3-based thin film thermoelectric generators," Materials Letters, May 2000, pp. 221-224, vol. 43.

Koga, T. et al., "Carrier pocket engineering to design superior thermoelectric materials using GaAs/AlAs superlattices," Appl. Phys. Lett., Nov. 16, 1998, pp. 2950-2952, vol. 73, No. 20.

Koga, T. et al., "Carrier pocket engineering applied to "strained" Si/Ge superlattices to design useful thermoelectric materials," Appl. Phys. Lett., Oct. 18, 1999, pp. 2438-2440, vol. 75, No. 16.

Shakouri, A. et al., "Heterostructure integrated thermionic coolers," Appl. Phys. Lett., Sep. 1, 1997, pp. 1234-1236, vol. 71, No. 9.

Snyder, G.J. et al., "Thermoelectric microwave fabricated by a MEMS-like electrochemical process," Nature Materials, Aug. 2003, pp. 528-531, vol. 2.

Tritt, T.M., "Recent Trends in Thermoelectric Materials Research III—Semiconductors and Semimetals," Recent Trends in Thermoelectric Materials Research III, 2001, pp. ix-xiv, vol. 71.

Vashaee, D. et al., "Improved Thermoelectric Power Factor in Metal-Based Superlattices," Physical Review Letters, Mar. 12, 2004, pp. 106103-1-106013-4, vol. 92, No. 10.

Venkatasubramanian, R. et al., "Thin-film thermoelectric devices with high room-temperature figures of merit," Nature, Oct. 11, 2001, pp. 597-602, vol. 413.

Zeng, G. et al., "ErAs/InGaAs superlattice Seebeck coefficient," IEEE, the proceedings of 24th International Conference on Thermoelectrics, 2005, pp. 485-488, Clemson University, South Carolina, USA.

Zeng, G. et al., "SiGe/Si superlattice power generators," IEEE, the proceedings of 24th International Conference on Thermoelectrics, 2005, pp. 164-167, Clemson University, South Carolina, USA.

Zide, J.M. et al., "Thermoelectric power factor in semiconductors with buried epitaxial semimetallic nanoparticles," Appl. Phys. Lett., 2005, pp. 112102-1-112102-3, vol. 87.

* cited by examiner

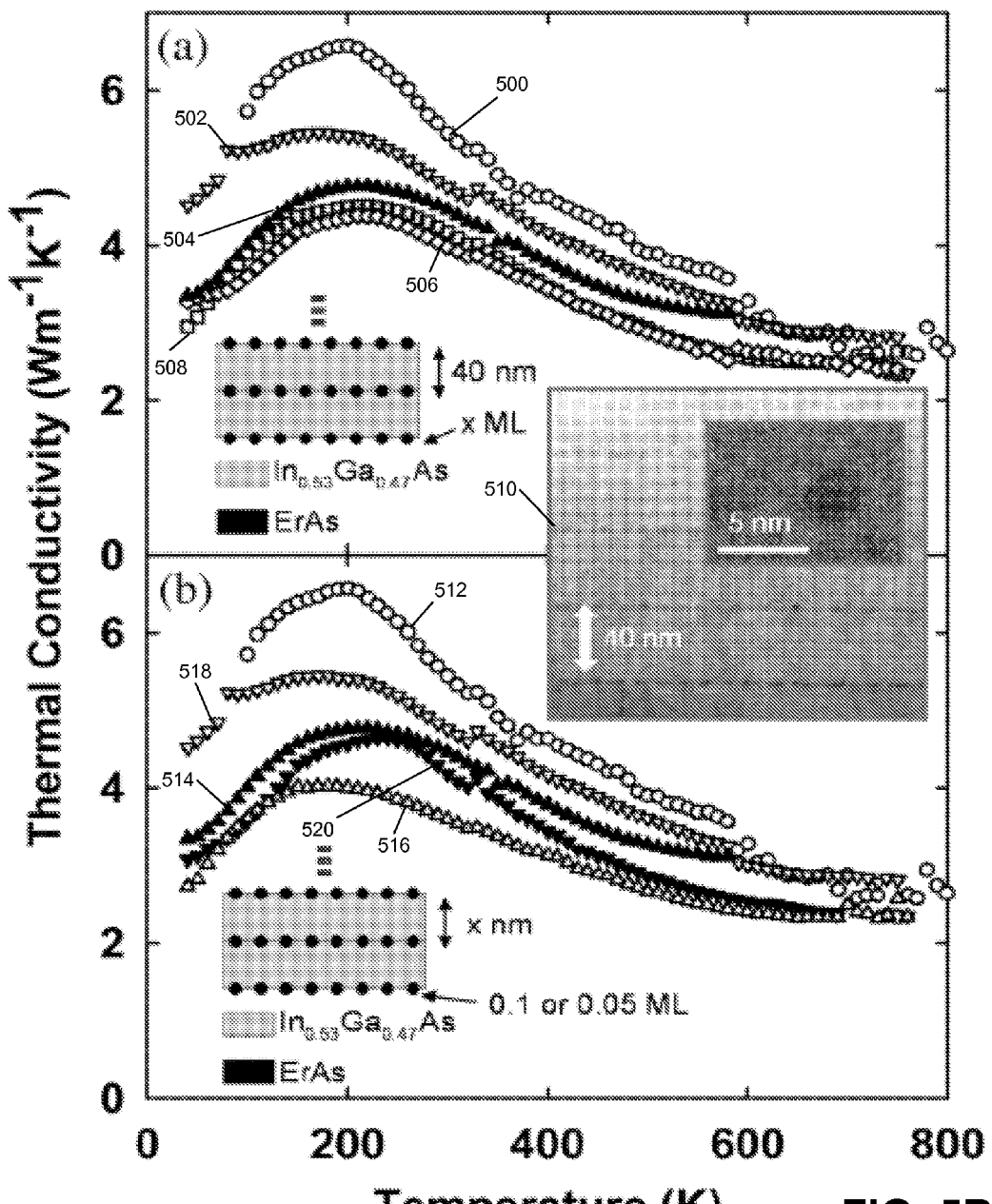

HIGH EFFICIENCY THERMOELECTRIC MATERIALS BASED ON METAL/SEMICONDUCTOR NANOCOMPOSITES

CROSS-REFERENCE TO RELATED APPLICATIONS

This application claims the benefit under 35 U.S.C. Section 119(e) of commonly-assigned U.S. provisional patent application, Ser. No. 60/815,159, titled Jun. 19, 2006, entitled "HIGH EFFICIENCY THERMOELECTRIC MATERIALS BASED ON METAL/SEMICONDUCTOR NANOCOMPOSITES," by Joshua M. O. Zide et al., which application is incorporated by reference herein.

STATEMENT REGARDING FEDERALLY SPONSORED RESEARCH AND DEVELOPMENT

This invention was made with Government support under Grant No. 442530-23110-3, Grant No. 442530-23104, and Grant No. N00014-03-1-0790, awarded by the ONR. The Government has certain rights in this invention.

BACKGROUND OF THE INVENTION

1. Field of the Invention

The present invention relates generally to semiconductor devices, and, more specifically, to high efficiency thermoelectric materials based on Metal/Semiconductor nanocomposites.

2. Description of the Related Art

Semiconductor chip level bonded devices have found uses in several consumer and commercial applications. Typically, semiconductor devices are made from a single type of material, or different types of material are grown onto a substrate based on lattice matching and compatible crystalline structures. Devices manufactured from III-V materials are typically grown on gallium arsenide or other compound semiconductor substrates. These devices are difficult to integrate with electronic devices fabricated on silicon.

Thermoelectric materials are used to convert between thermal and electrical energy. The two main applications are cooling using the Peltier effect and power generation using the Seebeck effect. Generally, the potential efficiency of thermoelectric materials is determined by ZT, which is a dimensionless figure of merit given by $S^2 \ast sigma \ast T/Kappa$, where S is the Seebeck coefficient, sigma is electrical conductivity, T is temperature, and Kappa is thermal conductivity. Generally, bulk materials have $ZT \leq 1$, with bismuth telluride being the dominant material at room temperature. Increasing ZT directly increases the efficiency of the material for cooling or power generation applications.

While bulk materials generally have $ZT \leq 1$, some bulk materials have slightly higher ZTs at high temperatures (>200° C. or 500K). For thin film materials, two groups have recently reported ZT~2 near room temperature, and one group has claimed ZT~3 at T=550K. In both cases, the materials are tellurides with nanostructure to decrease thermal conductivity and (possibly) increase the power factor ($S^2 \ast sigma$).

There is a need, then, for materials with a high ZT for use in applications where conversion between thermal and electrical energy is desired.

SUMMARY OF THE INVENTION

To minimize the limitations in the prior art, and to minimize other limitations that will become apparent upon reading and understanding the present specification, the present invention provides a technology for making thermoelectric materials based on metal/semiconductor nanocomposites.

We have determined that incorporating metallic nanoparticles into an appropriate semiconductor host matrix can create very efficient thermoelectric materials for use at high temperatures. Because the metal nanoparticles contain a large number of electrons of varying depths, carrier concentration (and therefore electrical conductivity) increases drastically with increasing temperature.

Also, some semiconductors, such as the InGaAlAs used in the present invention have multiple valleys in their conduction band which can become accessible with large electron concentrations. In this case, the L-valley states would drastically increase the electrical conductivity of the material. At the same time, the electrostatic Schottky barriers around the particle serve as energy-dependent electron scatterers. This results in a higher electrical conductivity from high energy carriers than low energy carriers and therefore a large Seebeck coefficient.

The presence of L-valley conduction can also increase the high-energy-carrier conduction, further increasing the Seebeck coefficient. A similar and related technique would be to use a wider-bandgap semiconductor to form conduction band barriers in a small bandgap semiconductor with metal nanoparticles. In this case, the intrinsic carriers would be the primary source of holes (p-type charge carriers) at high temperatures. An equal number of electrons are produced, but their motion is blocked by the barriers. As a result, a high electrical conductivity results (in this case, with holes as the charge carriers), but the Seebeck coefficient remains high because the Fermi level tends towards midgap due to the presence of electrons in the conduction band.

A nanocomposite material in accordance with the present invention comprises a III-V material, and a plurality of semi-metallic nanoparticles, coupled to the III-V material, wherein the plurality of semi-metallic nanoparticles increase a thermoelectric figure of merit of the III-V material.

Such a material further optionally comprises the plurality of semi-metallic or metallic nanoparticles being erbium arsenide, the III-V material being indium gallium arsenide, the plurality of semi-metallic nanoparticles being epitaxially grown on the III-V bulk material, a total atomic fraction of the erbium arsenide being 0.3%, the semi-metallic nanoparticles being deposited in monolayers, and the semi-metallic nanoparticles being deposited in an island structure in the III-V material.

Another material in accordance with the present invention comprises a III-V superlattice material and a plurality of nanoparticles, coupled to the III-V superlattice material, wherein the plurality of nanoparticles increase a thermoelectric figure of merit of the III-V superlattice material.

Such a material further optionally comprises the plurality of nanoparticles being semi-metallic nanoparticles, the semi-metallic nanoparticles being erbium arsenide, the III-V superlattice material being indium gallium arsenide, a total atomic fraction of the erbium arsenide being 0.3%, the III-V superlattice material being epitaxially grown on the plurality of nanoparticles, and the nanoparticles being deposited in monolayers.

A method of making a nanocomposite material in accordance with the present invention comprises growing a buffer layer on a substrate and growing a nanocomposite structure on the buffer layer, the nanocomposite structure comprising a III-V material and a nanoparticle material, wherein the nanoparticle material increases a thermoelectric figure of merit of the III-V material.

Such a method further optionally comprises the buffer layer comprising a buffer layer of InAlAs and n-InGaAs, the substrate being an InP substrate, the nanocomposite structure comprising a plurality of island structures of the nanoparticle material epitaxially grown within the III-V material, the nanocomposite structure comprising a superlattice matrix coupled to a plurality of monolayers of the nanoparticle material, and the nanoparticle material being erbium arsenide.

BRIEF DESCRIPTION OF THE DRAWINGS

Referring now to the drawings in which like reference numbers represent corresponding parts throughout:

FIGS. 5A and 5B illustrate the effect of ML thickness on the thermal conductivity of a ErAs=In$_{0.53}$Ga$_{0.47}$As superlattice.

DETAILED DESCRIPTION OF THE PREFERRED EMBODIMENTS

Figure 1:
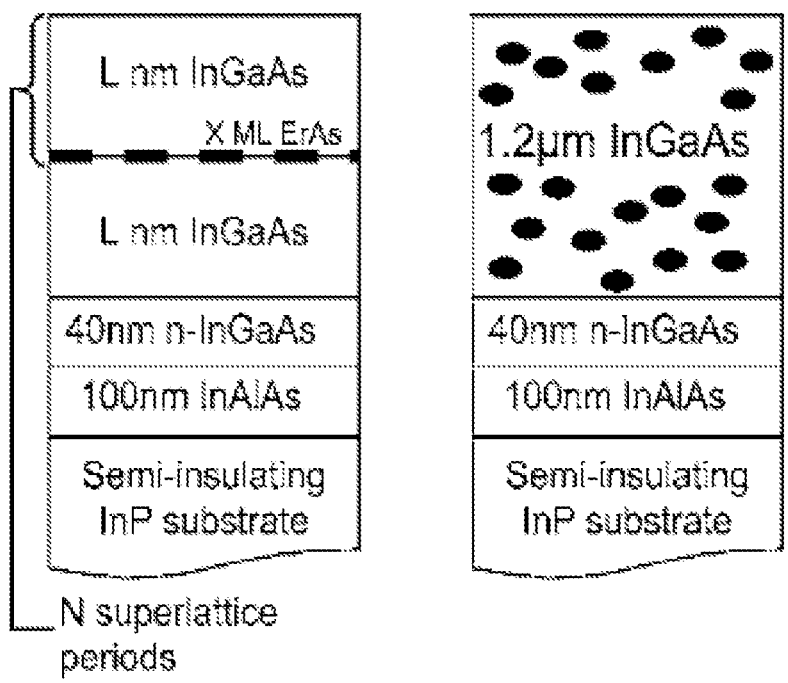
FIG. 1 illustrates sample structures of ErAs:InGaAs materials in accordance with the present invention. Structure A comprises superlattices of ErAs particles with depositions ranging from 0.05-0.4 ML and layer spacings ranging from 5 to 40 nm. Structure B comprises randomly distributed particles codeposited during semiconductor growth.

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

The big advantage of nanoparticle materials over existing materials for energy conversion devices is the potential for a much higher power factor and ZT, which would lead to a drastic increase in efficiency. The inclusion of nanoparticles provides a novel way of increasing conductivity with temperature through deep-level doping and also increase Seebeck coefficient through energy-dependent scattering. Additionally, the inclusion of ErAs decreases thermal conductivity, increasing ZT further.

The present invention further provides advantages in thermoelectric power generation for waste heat recovery, e.g., automobiles, fossil or nuclear power plants, waste burning, etc., radioisotope thermoelectric generator (RTG) for powering remote installations, satellites, etc., applicability for high temperature solid-state cooling, and new designs using appropriate III-V/ErAs nanocomposites that work well at room temperature. The present invention can also have a significant impact on solid-state refrigeration.

The present invention also increases the efficiency of thermoelectric power generators by increasing the efficiencies of existing thermoelectric materials to enable cost-effective power generation. Currently thermoelectric power generators are not widely used. This is because they have a low efficiency. A thermoelectric power generator with efficiencies exceeding 20-30% could be implemented in all cars to increase the gas mileage where ⅔ of the consumed energy is wasted as heat. Similarly, power plants run at 40-60% efficiency and a lot of low quality heat (i.e., small temperature differences) is currently not effectively used.

The Seebeck coefficient of thermoelectrical material is of great importance for thermoelectrical devices working either as coolers or generators. For TE coolers, the cooling power is proportional to the Seebeck coefficient of the element material, and the output power of thermal-to-electricity power generator is proportional to the square of the Seebeck coefficient.

A superlattice structure can enhance thermoelectrical device performance by the selective emission of hot carriers above the barrier layer thorough thermionic emissions[1]. And the figure of merit ZT of a semiconductor can also be improved by incorporating semi-metallic nano-particles into the material to form phonon scattering centers and increase carrier concentration. The metal-based superlattices with tall barriers can achieve a large effective thermoelectric figure of merit by electron filtering.

In-plane and cross-plane Seebeck coefficient for superlattices are usually different, mainly because of filtering effects. The in-plane Seebeck coefficient measurement is straightforward: building up a temperature difference across the sample and measuring the output voltage. By comparison, the measurements of cross-plane Seebeck coefficient are more obscure, for the temperature difference across superlattice layer of a few microns cannot be directly measured precisely.

Effects of Nanoparticles

Incorporating semimetallic nanoparticles into a semiconductor has a large effect on the properties of the semiconductor. The particles can act as dopants, buried Schottky barriers, deep states for carrier recombination or enhanced tunneling, and phonon scattering centers. Unlike bulk thermoelectric materials, these composites have the advantage of compatibility with the complex structures traditionally associated with semiconductor thin films, which allows the consideration of increasing the Seebeck coefficient via electron filtering as well as architectures which are optimized for the temperature gradient through the thickness of the device.

The present invention demonstrates the growth of structures comprising superlattices of self-assembled semimetallic ErAs particles in a matrix of GaAs or In$_{0.53}$Ga$_{0.47}$As. The nanometer-sized particles grow epitaxially in the rocksalt crystal structure. Incorporating ErAs into InGaAs produces n-type material with a free electron concentration which increases with decreasing particle size.

Atomic substitution in alloys efficiently scatters phonons, thereby reducing the thermal conductivity in crystalline solids to the "alloy limit." Using In$_{0.53}$Ga$_{0.47}$As containing ErAs nanoparticles, the present invention demonstrates thermal conductivity reduction by almost a factor of 2 below the alloy limit and a corresponding increase in the thermoelectric figure of merit by a factor of 2. A theoretical model suggests that while point defects in alloys efficiently scatter short-wavelength phonons, the ErAs nanoparticles of the present invention provide an additional scattering mechanism for the mid-to-long-wavelength phonons.

The performance of thermoelectric energy conversion devices depends on the thermoelectric figure of merit (ZT) of a material defined as $ZT = S^2 \sigma T/k$, where S, σ, k, and T are the Seebeck coefficient, electrical conductivity, thermal conductivity, and absolute temperature, respectively. While $S^2 \sigma$ can be maximized by doping, it is necessary to use a semiconductor with crystalline order to achieve high carrier mobility. The lowest thermal conductivity in crystalline solids is generally that of an alloy—often called the "alloy limit"—due to scattering of phonons by atomic substitutions. Historically, it has been challenging to increase ZT>1 because of the difficulty of reducing thermal conductivity below the alloy limit.

It has been difficult to beat the alloy limit in crystals without creating defects, dislocations, and voids. For example, thermal conductivity of pressure-sintered $Si_{0.8}Ge_{0.2}$ alloy was shown to be less than that of the crystalline alloy due to heavy point defects. However, ZT was not increased due to a proportional reduction in electrical conductivity. There are reports that the thermal conductivity of a Si/Ge superlattice can be lower than that of a $Si_xGe_{1-x}$ alloy. However, because of the large lattice mismatch (~4%) between Si and Ge, the strain in Si/Ge superlattices produces defects and dislocations when the layer thickness exceeds a critical value. Such approaches also have not led to significant increases in ZT, thus suggesting that the electrical conductivity also reduces proportionally. More recently, despite systematically increasing the interfacial acoustic impedance mismatch in a $Si_yGe_{1-y}/Si_xGe_{1-x}$ superlattice, this approach failed to reduce the thermal conductivity below that of a $Si_xGe_{1-x}$ alloy without creating significant defects in the superlattice.

The present invention demonstrates and explains the theory behind the possibility of beating the alloy limit using uncorrelated phonon scattering. The present invention uses $In_{0.53}Ga_{0.47}As$ as the alloy, in which ErAs nanoparticles, a few nanometers in diameter, are epitaxially embedded. In alloys such as $In_{0.53}Ga_{0.47}As$, atomic substitutions scatter phonons due to differences in mass and/or bond stiffness.

Growth of Nanoparticle Materials

All samples were grown on an InP substrate with a buffer layer of 100 nm InAlAs and 40 nm of n-type InGaAs doped with $5\times10^{18}$ cm$^{-3}$ silicon using a molecular beam epitaxy system at 490° C. to eliminate the effect of growth temperature on thermal conductivity. The total thickness of $In_{0.53}Ga_{0.47}As$ film containing ErAs nanoparticles was either 1.2 or 1.6 μm.

Two types of samples were grown, namely: (i) ErAs nanoparticles in a superlattice structure inside the $In_{0.53}Ga_{0.47}As$ matrix and (ii) ErAs nanoparticles that are randomly distributed in the three-dimensional $In_{0.53}Ga_{0.47}As$ matrix. The inset in FIG. 5A shows transmission electron microscope (TEM) images of a 0.4 monolayer (ML) ErAs/$In_{0.53}Ga_{0.47}As$ superlattice after thermal conductivity measurements up to 800 K. The black dots in the figure correspond to ErAs nanoparticles and the dark gray layer corresponds to $In_{0.53}Ga_{0.47}As$.

The present invention studied two types of sample structures in detail, which will be referred to as structures A and B shown in FIG. 1. Other structures incorporating nanoparticles or nanoislands are possible within the scope of the present invention.

Structure A comprises a superlattice of ErAs islands in InGaAs with ErAs depositions of 0.05, 0.1, 0.2, and 0.4 monolayers (ML) per period and layer spacings of 5, 10, 20, and, 40 nm. Although Erbium Arsenide is discussed, other materials, such as rare-earth-group V compounds or compounds having a rocksalt structure, can be used as the nanoparticles without departing from the scope of the present invention. Layer spacings were chosen to keep the total atomic fraction of ErAs fixed at 0.3%, and the number of periods were chosen to keep a constant total thickness of 1.2 microns. Particle depositions are stated as though the ErAs grew in a layer-by-layer growth mode; larger depositions result in larger islands.

For each structure, a sample was grown both doped solely by ErAs and co-doped with $5\times10^{18}$ cm$^{-3}$ silicon. Structure B contains ErAs particles randomly distributed throughout the semiconductor and has the same thickness of 1.2 microns and atomic fraction of 0.3%. Each sample is grown on a buffer layer of 100 nm InAlAs and 40 nm n-InGaAs, lattice-matched to an InP substrate. The ErAs has a lattice mismatch of approximately 2% to the substrate and films.

All samples were grown using a Varian Gen II molecular beam epitaxy system on (100) semi-insulating InP:Fe substrates. The substrate temperature was measured at 490° C. using a pyrometer.

Figure 2:
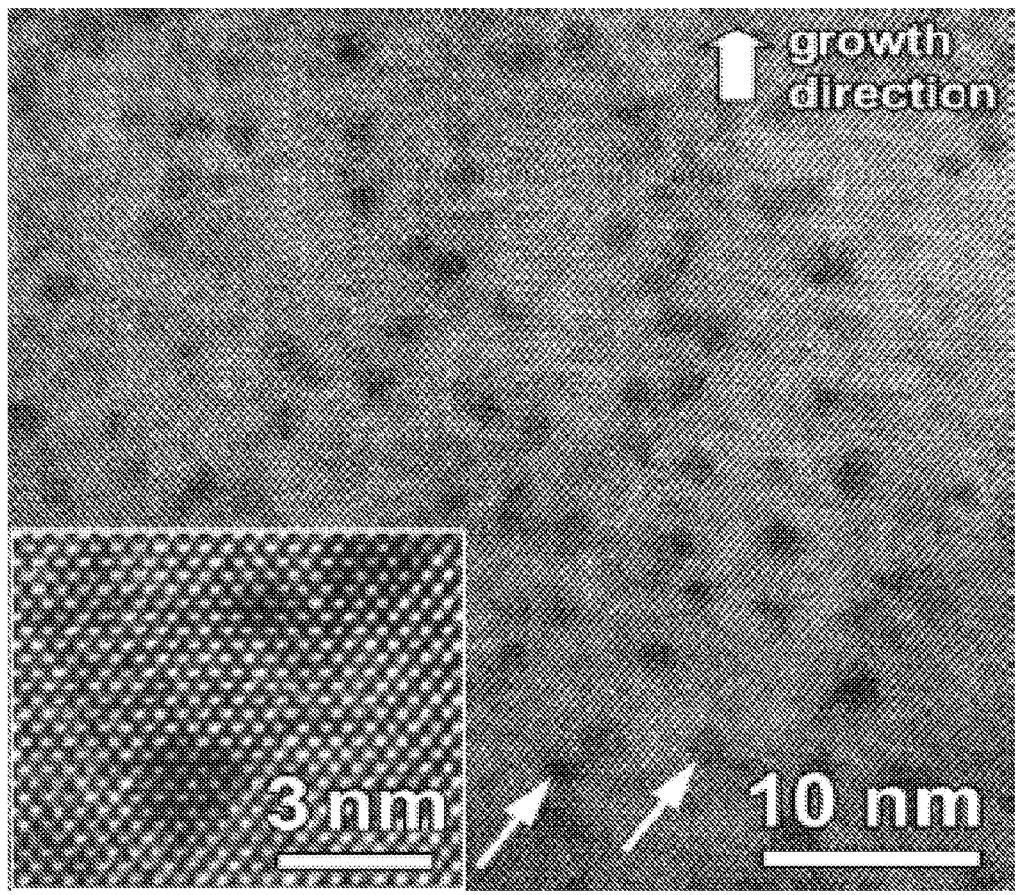
FIG. 2 illustrates high-resolution cross-sectional transmission electron micrograph of randomly distributed particles in structure B of FIG. 1. The micrograph confirms the formation of nanometer sized particles. The spatial distribution of the particles appears to be essentially random. For clarity, several particles are highlighted with arrows.

Structure B was grown by co-depositing erbium at a growth rate corresponding to the desired atomic fraction during the growth of the semiconductor. Growth rates for ErAs were determined by beam fluxes from the erbium source. Cross-section transmission electron microscopy samples of this structure were prepared by standard TEM sample preparation techniques with 3 kV Ar ion milling as the final step (Gatan PIPS). High-resolution TEM (HRTEM) was performed using a field-emission TEM (Tecnai F30U) with ultratwin objective lens (Cs=0.52 mm), operated at 300 kV. A cross-section high-resolution transmission electron micrograph of the structure B sample is shown in FIG. 2.

The electrical conductivity of each sample was measured using room temperature Hall measurements in a van der Pauw geometry. The free electron concentration and mobility of each sample are plotted in FIGS. 3(a) and 3(b), respectively.

Figures 3A, 3B, 3C, 3D:
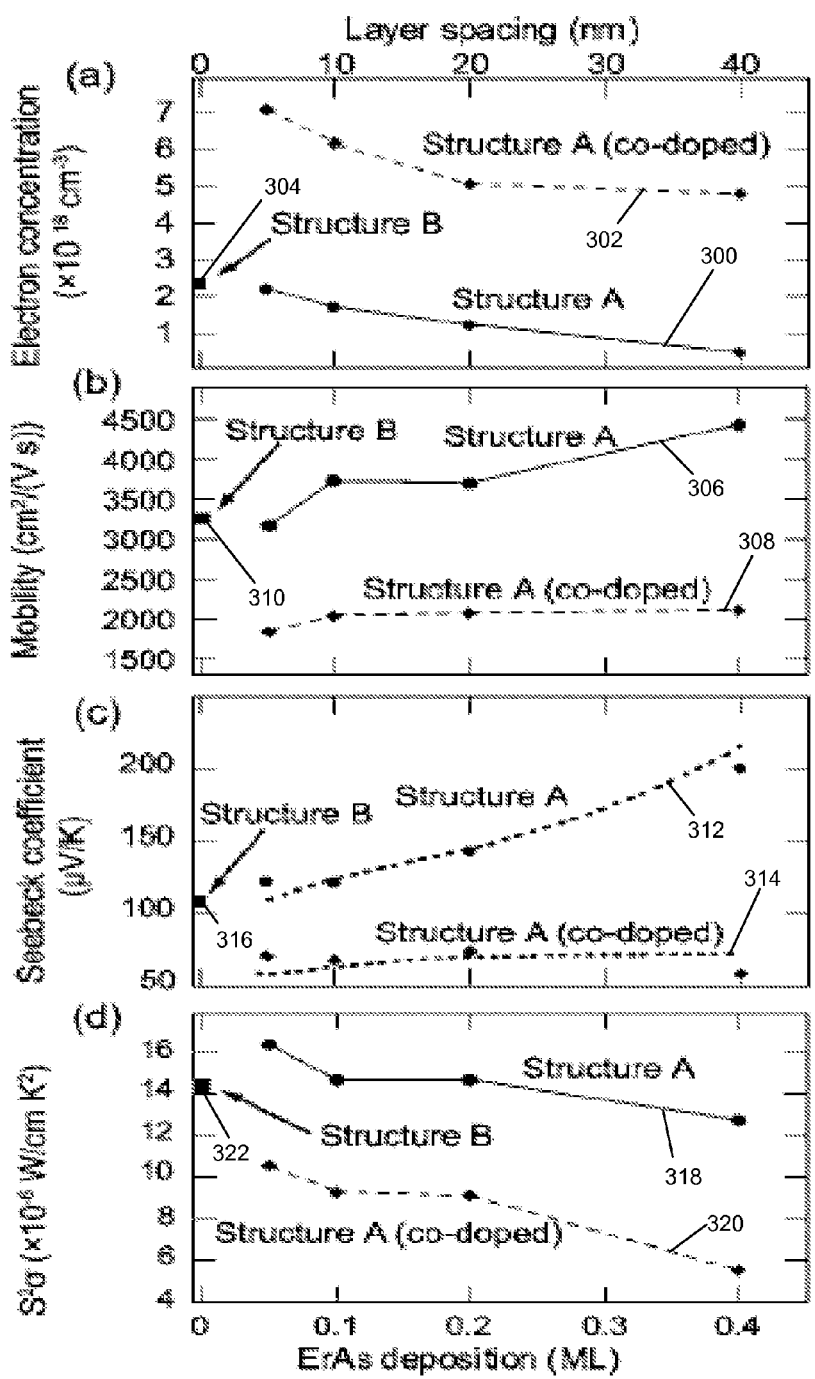
FIGS. 3A-3D illustrate electronic properties of ErAs:InGaAs structures.

FIG. 3A illustrates free electron concentration v. ML of ErAs deposition of structure A of FIG. 1. Graph 300 shows the electron concentration of Structure A doped with ErAs only, while graph 302 shows the electron concentration of structure A with $5\times10^{18}$ cm$^{-3}$ Si codoping. Graph 304 illustrates the electron concentration of structure B. All of the graphs 300-304 shown electron concentrations at room temperature.

FIG. 3B illustrates electron mobility of structures A and B at room temperature. Graph 306 shows the electron mobility of Structure A doped with ErAs only, while graph 308 shows the electron mobility of structure A with $5\times10^{18}$ cm$^{-3}$ Si codoping. Graph 310 illustrates the electron concentration of structure B. All of the graphs 306-310 shown electron mobilities at room temperature.

FIG. 3C illustrates in-plane Seebeck coefficient of structures A and B. Graph 312 shows the in-plane Seebeck coefficient of Structure A doped with ErAs only, while graph 314 shows the in-plane Seebeck coefficient of structure A with $5\times10^{18}$ cm$^{-3}$ Si codoping. Graph 316 illustrates the in-plane Seebeck coefficient of structure B. The dotted curves of graphs are calculated using a linear Boltzmann transport equation.

FIG. 3D illustrates $S^2$sigma, which appears in the thermoelectric figure of merit, of structures A and B. Graph 318 shows the $S^2$sigma of Structure A doped with ErAs only, while graph 320 shows the $S^2$sigma of structure A with $5\times10^{18}$ cm$^{-3}$ Si codoping. Graph 322 illustrates the $S^2$sigma of structure B.

The free electron concentration decreases with increasing particle size, which is in agreement with earlier work. In addition, temperature-dependent Hall measurements were taken of structure B and the structure A sample containing the smallest particles. The obtained free electron concentrations and mobilities as a function of temperature from 4-400 K are plotted in FIG. 4. Structure B is similar in electrical conductivity to structure A.

Figures 4A, 4B:
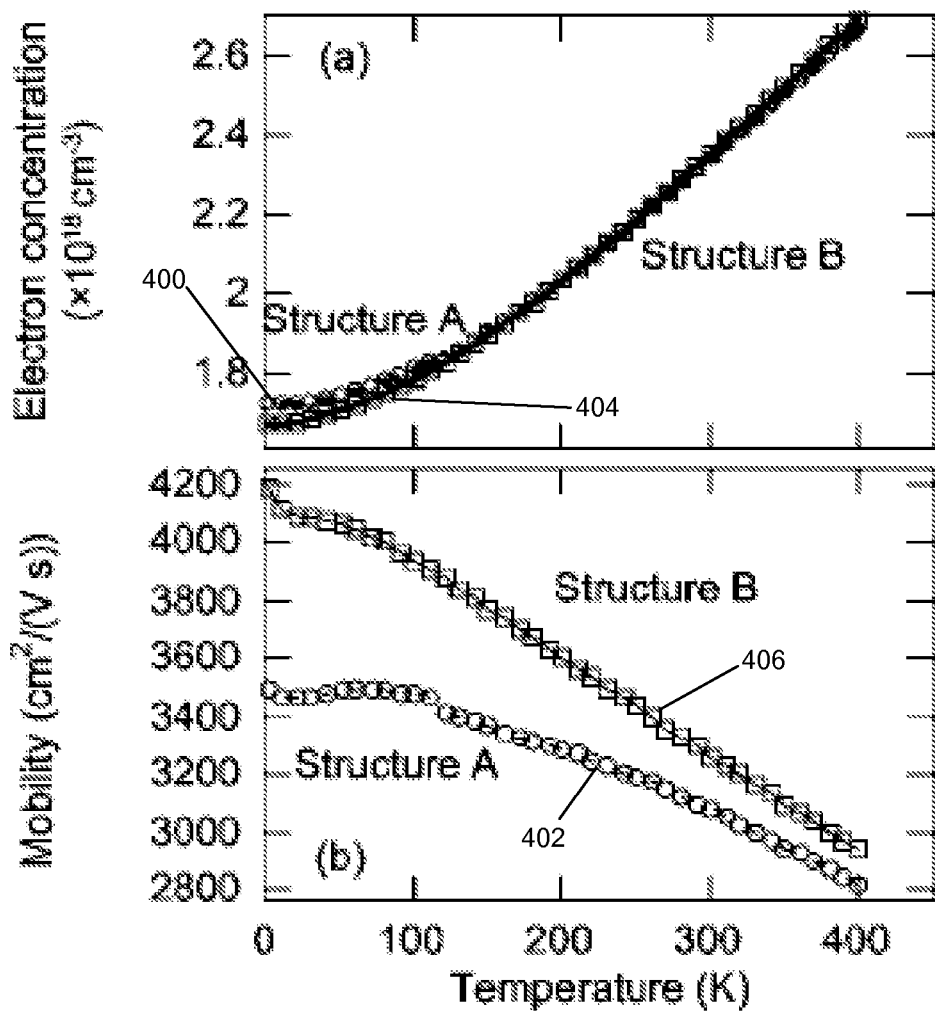
FIGS. 4A and 4B illustrate temperature dependent Hall data of the structures of the present invention.

FIGS. 4A and 4B illustrate temperature dependent Hall data. Graphs 400 and 402 illustrate the data associated with structure A sample with 0.05 ML deposition and 5 nm spacing using circles, while graph 404 and 406 shows the data associated with structure B using squares, over the temperature range 4-400 K. FIG. 4A illustrates the free electron concentration and FIG. 4B illustrates the electron mobility.

The Seebeck coefficient is the ratio of the voltage across a thermal gradient to the magnitude of that gradient and was measured by using a thermoelectric cooler to create a gradient across a small sample of each structure. Metal contacts were patterned and the differences in voltage and temperature across the gradient were measured. The theoretical in-plane Seebeck coefficients of the materials were then calculated assuming an effective electron mass of 0.06 me and a nonparabolicity coefficient of 1.167 eV-1.17 A momentum relaxation time of 0.063 to 0.15 ps was assumed which matches the experimental mobility data in FIG. 3B (1851 cm2/Vs for a doping of 7×1018 cm−3 and 4430 cm2/Vs for a doping of 4.5×1017 cm−3). In FIG. 3(c), the theoretical Seebeck coefficient (dotted curve) and experimental values of Seebeck coefficient (points) are compared. As expected, the measured Seebeck coefficient decreases with increasing electron concentration and agrees reasonably well with the calculated values.

In FIG. 3(d), the thermoelectric power factor, S2 σ, is plotted. The figure of merit is higher for samples with smaller particles and without silicon codoping. Measurements of thermal conductivity in the cross-plane direction on these samples show a decrease in thermal conductivity by approximately a factor of 2-3. The decreases are only relatively weakly dependent on particle size. Neglecting this weak dependence, the highest ZT would be obtained in the samples with the smallest depositions.

The measurements of electrical and thermoelectric properties were performed in the plane of the wafer, while power generators could use either in-plane or cross-plane directions. Structure B should be isotropic, but the electrical properties of structure A may vary substantially in the cross-plane direction. The measured electron mobility in structure A is an average mobility. The actual mobility is likely to vary as a function of distance from the ErAs layers, with lower mobilities in layers containing ErAs and higher mobilities between layers. Cross-plane electrical conductivity and Seebeck coefficients are difficult to measure directly. Besides the advantage of unambiguous measurement of electrical properties due to isotropy, structure B has the additional advantage of not requiring growth interrupts. This results in a faster growth and therefore less concern about the stability of sources in a relatively long molecular beam epitaxy growth.

For the purpose of thermal conductivity measurements, a silicon dioxide layer (~0:18 μm) was deposited on top of the samples at room temperature using plasma-enhanced chemical vapor deposition. The differential 3 ω method was used to measure thermal conductivity. A platinum (~380 nm thick and 30 μm wide) film with chromium (~4 nm thick) as an adhesion layer was deposited and patterned on top of the silicon dioxide layer for the heater and thermometer. Thermal conductivity measurements were performed in a cryostat. TEM images and the repeatability of the thermal conductivity measurements showed that material degradation did not occur over several temperature cycles, as shown in the inset in FIG. 5A.

FIGS. 5A and 5B illustrate the effect of ML thickness on the thermal conductivity of a ErAs=$In_{0.53}Ga_{0.47}As$ superlattice. Graph 500 illustrates the thermal conductivity of $In_{0.53}Ga_{0.47}As$ (open circles) is shown as a comparison. Graphs 502-508 show ErAs deposition as the deposition is varied from 0.05 ML (graph 502), 0.1 ML (graph 504), 0.2 ML (graph 506), to 0.4 ML (graph 508). The inset 510 shows TEM pictures of 0.4 ML with a 40 nm period thickness ErAs=In0:53Ga0.47As superlattice. FIG. 5B illustrates the effect of superlattice period on the thermal conductivity of a ErAs=In0:53Ga0:47As superlattice. Graph 512 illustrates the thermal conductivity of $In_{0.53}Ga_{0.47}As$ as a comparison. Two different depositions are considered. One is 0.1 ML with 40 nm (graph 514, solid upward triangles) and 10 nm (graph 516, open upward triangles) and the other is 0.05 ML with 40 nm (graph 518, open downward triangles) and 5 nm (graph 520, solid downward triangles).

By incorporating ErAs nanoparticles into In0:53Ga0.47As, we observed that the thermal conductivity is lower than that of pure In0:53Ga0:47As alloy over a wide temperature range, with the largest reduction between 150 and 450 K [see FIG. 5A]. This supports our hypothesis that, in addition to alloy scattering of phonons, there must be additional phonon scattering due to the ErAs nanoparticles. At temperatures above 600 K, umklapp phonon scattering starts to dominate over other scattering processes, thus producing only marginal reduction over the thermal conductivity of In0:53Ga0:47As.

To explore the effects of ErAs particle size, the thermal conductivity of ErAs/In0:53Ga0:47As was measured in the superlattice samples with a period thickness fixed at 40 nm as shown in FIG. 5A. Particle sizes are expressed in terms of ErAs deposition, which is given as the equivalent monolayer fraction (a fractional monolayer) if the ErAs grew as a complete film. ErAs grows in an island (Volmer-Weber) growth mode, and the island size is directly proportional to the amount deposited. For depositions greater than 0.1 ML, the dependence of thermal conductivity on ErAs particle size is less pronounced. As shown in FIG. 5A, ErAs nanoparticles are epitaxially embedded in $In_{0.53}Ga_{0.47}As$.

However, the thermal conductivity of 0.05 ML is higher than those of other samples containing ErAs, although it is still less than that of In0:53Ga0:47As. By increasing the deposition beyond 0.1 ML, the average ErAs nanoparticle size also increases. However, there may be a sufficient number of scatterers for the mid-wavelength phonons that increasing the size has minimal effect on the thermal conductivity. Reducing the deposition to 0.05 ML reduces the average particle size, making it less effective in scattering the mid-wavelength phonons, thus producing a higher thermal conductivity.

The effect of period thickness over the thermal conductivity is shown in FIG. 5B. It is evident that ErAs/In0:53Ga0:47As superlattices with shorter period thickness have lower thermal conductivity. The fact that thermal conductivity is dependent upon period thickness of a few tens of nanometers implies that the mean free path of a fraction of heat carrying phonons must be influenced and controlled by scattering from ErAs nanoparticles. Since short-wavelength phonons are scattered by the alloy atoms, this gives further evidence that mid-to-long-wavelength phonons are important in heat conduction in such materials.

However, the thermal conductivity increases again as in the case of 0.05 ML with 5 nm period thickness even though it has short period. This could be explained using the results of FIG. 5A. The size of ErAs in 0.05 ML is not large enough to effectively scatter the mid-wavelength phonons to reduce the thermal conductivity of In0:53Ga0:47As. One can, therefore, conclude that to reduce thermal conductivity below that of In0:53Ga0:47As, the size of ErAs nanoparticles should be sufficiently large that the scattering regime does not overlap with the Rayleigh scattering of the atomic scale defects in alloys.

Figure 6A:
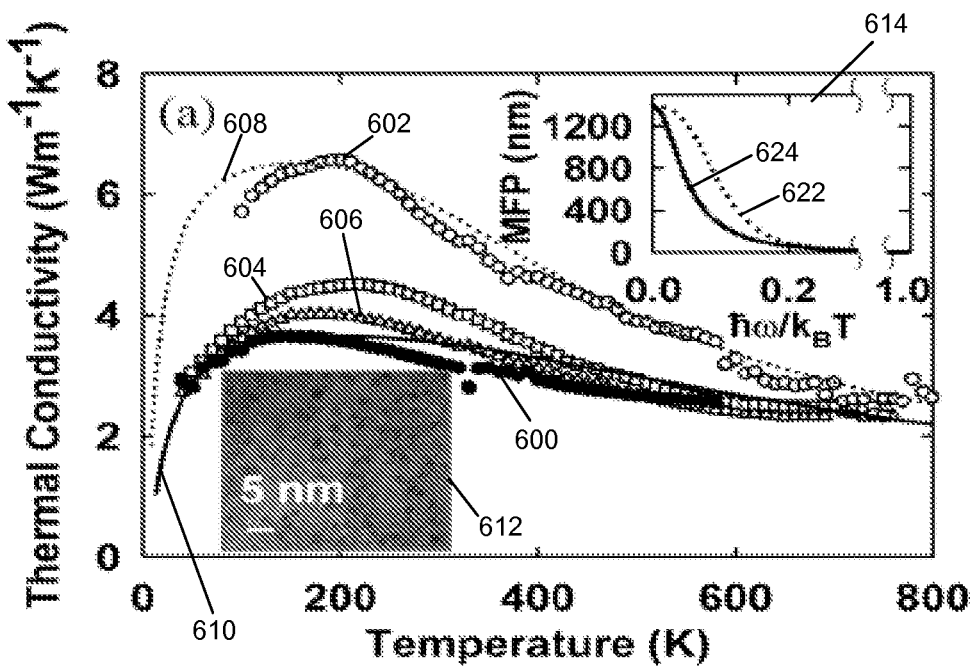
FIGS. 6A and 6B illustrate the thermal conductivity of randomly distributed ErAs in In$_{0.53}$Ga$_{0.47}$As and the resulting enhancement of the thermoelectric figure of merit at 300K.
Figure 6B:
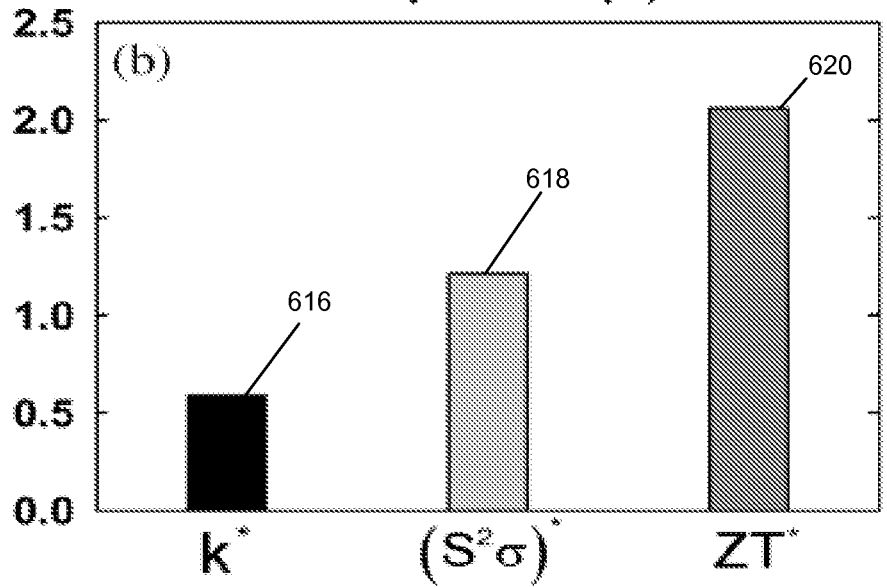

FIGS. 6A and 6B illustrate the thermal conductivity of randomly distributed ErAs in $In_{0.53}Ga_{0.47}As$ and the resulting enhancement of the thermoelectric figure of merit at 300K. (graph 600, solid circles). Thermal conductivity of a In0:53Ga0:47As alloy (graph 602, open circles), 0.4 ML with a 40 nm period thickness ErAs=In0:53Ga0:47As superlattice (graph 604, open squares) and 0.1 ML with a 10 nm period thickness ErAs=In0:53Ga0:47As superlattice (graph 606, open upward triangles) are shown as references. Dotted graph 608 and solid graph 610 are based on theoretical analysis.

The inset 612 shows TEM pictures of randomly distributed ErAs in In0:53Ga0:47As. Another inset 614 shows the phonon mean free path (MFP) versus normalized frequency at 300 K.

FIG. 6B illustrates the resulting enhancement of the thermoelectric figure of merit at 300 K. Thermal conductivity 616, power factor 618, and the figure of merit ZT 620 of randomly distributed ErAs in In0:53Ga0:47As are normalized by the corresponding values of In0:53Ga0:47As.

The inset 612 in FIG. 6A shows a TEM image of a sample where the ErAs nanoparticles are randomly distributed through the In0:53Ga0:47As matrix. The total concentration of Er in randomly distributed ErAs in In0:53Ga0:47As is fixed at 0.3%. FIG. 6A plots the thermal conductivity of randomly distributed ErAs in In0:53Ga0:47As. It is clear that this exhibits the lowest measured values compared to those of superlattice samples, which are shown as reference. We will assume that, for the sample containing randomly distributed ErAs nanoparticles, the thermal conductivity is isotropic and can be compared to predictions of an isotropic model.

To understand the role of ErAs in reducing the thermal conductivity below the alloy limit, the thermal conductivity is predicted using Callaway's model and shown as the dotted 608 and the solid 610 lines in FIG. 6A.

Incorporating ErAs nanoparticles in In0:53Ga0:47As has three effects on the thermal conductivity: (i) increase due to electronic contribution, since semimetallic ErAs nanoparticles act as dopants, (ii) decrease of phonon contribution due to electron-phonon scattering, and (iii) phonon scattering due to ErAs nanoparticles. In the temperature range where thermal conductivity reduction due to ErAs is most evident, the predicted electronic contribution to thermal conductivity is marginal. Furthermore, the electron-phonon scattering contribution is also negligible. Hence, τ D plays a dominant role in thermal conduction when ErAs nanoparticles are embedded.

Here 1/V is the volume density of ErAs particles, which is fixed considering the total concentration of Er is 0.3% in randomly distributed ErAs in In0:53Ga0:47As. Based on the TEM image in FIG. 6A, the mean diameter b of the ErAs nanoparticles was found to be 2.4 nm. The only assumption in this analysis is that the probability distribution is chosen to be a gamma function. To fit the maximum thermal conductivity, a value of 1.9 nm was chosen for the standard deviation. This value was used to predict the thermal conductivity over the whole temperature range. Given the TEM image in FIG. 6A and the lack of control over the size of ErAs during growth process in randomly distributed ErAs in In0:53Ga0:47As, such a value seems reasonable. The agreement between predictions and experimental data suggests that we have a possible explanation of how and why nanoparticles reduce the thermal conductivity below the alloy limit. In contrast to previous work, the present invention shows the alloy limit can be beaten with nonperiodic structures. This may considerably simplify the manufacturing of such materials for thermoelectric applications, since periodic structures require more stringent control and are more time consuming.

The inset 614 in FIG. 6A shows the phonon mean free path versus normalized frequency at 300 K. The dotted line 622 corresponds to the mean free path of In0:53Ga0:47As, and the solid line 624 denotes that of randomly distributed ErAs nanoparticles in In0:53Ga0:47As. This theoretical analysis clearly demonstrates that ErAs nanoparticles scatters the low and intermediate phonon spectrum.

It should be noted that ErAs is a semimetal that can act as an electron donor in In0:53Ga0:47As, which should increase the electrical conductivity and reduce the thermopower in In0:53Ga0:47As. The room-temperature thermal conductivity, power factor (S2 σ), and the thermoelectric figure of merit (ZT) of randomly distributed ErAs in In0:53Ga0:47As are normalized by the corresponding values of In0:53Ga0:47As and shown in FIG. 6B. The power factor of randomly distributed ErAs in In0:53Ga0:47As is slightly higher than that of In0:53Ga0:47As [22], and yet thermal conductivity reduction is by almost a factor of 2 below the alloy limit. The resulting ZT is increased more than a factor of 2, mostly due to reduction of the thermal conductivity.

In summary, by epitaxially incorporating nanoparticles of ErAs in an alloy of In0:53Ga0:47As, a significant reduction in thermal conductivity over that of In0:53Ga0:47As was observed. A corresponding increase in zt by more than a factor of 2 was also observed. Theoretical analysis revealed ErAs nanoparticles scatter mid-to-long-wavelength phonons, while atomic scale defects in In0:53Ga0:47As effectively scatter the Brillouin zone edge phonons. In the case of randomly distributed ErAs in In0:53Ga0:47As, there is a large size distribution of ErAs nanoparticles, which effectively scatters a wide phonon spectrum.

CONCLUSION

In summary, by epitaxially incorporating nanoislands of ErAs in an alloy of $In_{0.53}Ga_{0.47}As$, a significant reduction in thermal conductivity over that of $In_{0.53}Ga_{0.47}As$ was observed over a 40-800K temperature range. Corresponding increases in thermoelectric figure of merit were more than a factor of two. Analysis reveals that ErAs nanoislands scatter mid-to-long wavelength phonons, while the atomic scale defects in $In_{0.53}Ga_{0.47}As$ effectively scatter the Brillouin zone edge phonons. In the case of randomly distributed ErAs in $In_{0.53}Ga_{0.47}As$, there is large size distribution of ErAs which effectively scatters a wide phonon spectrum. While the absolute value of the figure of merit of ErAs/$In_{0.53}Ga_{0.47}As$ is not as high compared to that of Bi or Pb-based nanostructured materials. ErAs increases the free electron concentration of InGaAs while maintaining relatively high mobilities. Seebeck coefficients in reasonable agreement with a linear Boltzmann transport model were measured for several sample structures.

This concept of introducing nanoparticles into a semiconductor matrix as presented in this specification is generally applicable to any type of metallic nanoparticle included within any semiconductor matrix. Further, although growth of such materials is presented herein as being performed by MBE, growth by other techniques are possible within the scope of the present invention.

A nanocomposite material in accordance with the present invention comprises a III-V material, and a plurality of semimetallic nanoparticles, coupled to the III-V material, wherein the plurality of semi-metallic nanoparticles increase a thermoelectric figure of merit of the III-V material.

Such a material further optionally comprises the plurality of semi-metallic or metallic nanoparticles being erbium arsenide, the III-V material being indium gallium arsenide, the plurality of semi-metallic nanoparticles being epitaxially grown on the III-V bulk material, a total atomic fraction of the erbium arsenide being 0.3%, the semi-metallic nanoparticles being deposited in monolayers, and the semi-metallic nanoparticles being deposited in an island structure in the III-V material.

Another material in accordance with the present invention comprises a III-V superlattice material and a plurality of nanoparticles, coupled to the III-V superlattice material, wherein the plurality of nanoparticles increase a thermoelectric figure of merit of the III-V superlattice material.

Such a material further optionally comprises the plurality of nanoparticles being semi-metallic nanoparticles, the semi-metallic nanoparticles being erbium arsenide, the III-V superlattice material being indium gallium arsenide, a total atomic fraction of the erbium arsenide being 0.3%, the III-V superlattice material being epitaxially grown on the plurality of nanoparticles, and the nanoparticles being deposited in monolayers.

A method of making a nanocomposite material in accordance with the present invention comprises growing a buffer layer on a substrate and growing a nanocomposite structure on the buffer layer, the nanocomposite structure comprising a III-V material and a nanoparticle material, wherein the nanoparticle material increases a thermoelectric figure of merit of the III-V material.

Such a method further optionally comprises the buffer layer comprising a buffer layer of InAlAs and n-InGaAs, the substrate being an InP substrate, the nanocomposite structure comprising a plurality of island structures of the nanoparticle material epitaxially grown within the III-V material, the nanocomposite structure comprising a superlattice matrix coupled to a plurality of monolayers of the nanoparticle material, and the nanoparticle material being erbium arsenide.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but by the claims appended hereto and the full range of equivalents to the claims thereof.

What is claimed is:

1. A nanocomposite material, comprising:
   a III-V material; and
   a plurality of semi-metallic nanoparticles, co-deposited and randomly distributed within at least some layers of the III-V material in a three-dimensional matrix of the III-V material, wherein the plurality of semi-metallic nanoparticles increase a thermoelectric figure of merit of the III-V material.

2. The nanocomposite material of claim 1, wherein the plurality of semi-metallic nanoparticles are erbium arsenide.

3. The nanocomposite material of claim 1, wherein the plurality of semi-metallic nanoparticles are rare-earth-group V compounds.

4. The nanocomposite material of claim 1, wherein the plurality of semi-metallic nanoparticles have a rocksalt structure.

5. The nanocomposite material of claim 2, wherein the III-V material is indium gallium arsenide.

6. The nanocomposite material of claim 5, wherein the plurality of semi-metallic nanoparticles are epitaxially grown within the III-V material.

7. The nanocomposite material of claim 5, wherein a total atomic fraction of the erbium arsenide is 0.3%.

8. A nanocomposite material, comprising:
   a III-V superlattice material comprised of a plurality of layers; and
   a plurality of nanoparticles, co-deposited, epitaxially embedded, and randomly distributed, within at least some of the layers of a three-dimensional matrix of the III-V superlattice material, wherein the plurality of nanoparticles increase a thermoelectric figure of merit of the III-V superlattice material.

9. The nanocomposite material of claim 8, wherein the plurality of nanoparticles are semi-metallic nanoparticles.

10. The nanocomposite material of claim 9, wherein the semi-metallic nanoparticles are erbium arsenide.

11. The nanocomposite material of claim 9, wherein the semi-metallic nanoparticles have a rocksalt structure.

12. The nanocomposite material of claim 9, wherein the semi-metallic nanoparticles are rare-earth-group V compounds.

13. The nanocomposite material of claim 10, wherein the III-V superlattice material is indium gallium arsenide.

14. The nanocomposite material of claim 13, wherein a total atomic fraction of the erbium arsenide is 0.3%.

* * * * *